United States Patent
Desai et al.

(10) Patent No.: US 6,466,497 B1
(45) Date of Patent: Oct. 15, 2002

(54) SECONDARY PRECHARGE MECHANISM FOR HIGH SPEED MULTI-PORTED REGISTER FILES

(75) Inventors: Shaishav A. Desai, San Jose, CA (US); Anup S. Mehta, Fremont, CA (US); Srinivasa Gopaladhine, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/838,774

(22) Filed: Apr. 17, 2001

(51) Int. Cl.$^7$ .................................................. G11C 7/00
(52) U.S. Cl. ...................... 365/203; 365/204; 365/202; 365/189.07
(58) Field of Search ........................ 365/189.01, 230.01, 365/203, 204, 189.07

(56) References Cited

U.S. PATENT DOCUMENTS

| | | | |
|---|---|---|---|
| 4,905,197 A | * 2/1990 | Urai | 365/204 |
| 5,673,232 A | * 9/1997 | Furutani | 365/226 |
| 5,828,610 A | * 10/1998 | Rogers et al. | 365/203 |
| 5,907,517 A | * 5/1999 | Komarek et al. | 365/210 |
| 5,990,729 A | * 11/1999 | Kozuka et al. | 327/543 |

* cited by examiner

*Primary Examiner*—Viet Q. Nguyen
(74) *Attorney, Agent, or Firm*—Hamilton & Terrile, LLP; Stephen A. Terrile

(57) ABSTRACT

An electronic circuit has a register connected to a sense amplifier via a bitline (the sense amplifier has a primary precharge circuit), and a secondary precharge circuit also connected to the bitline. For bitlines that are relatively long, the secondary precharge circuit is located at a distal end of the bitline with respect to the sense amplifier. The secondary precharge circuit initially pulls up the voltage of the bitline, and the primary precharge circuit in the sense amplifier completes the precharging of the bitline. The secondary precharge circuit includes a cascode transistor coupled to the bitline via a feedback circuit. The feedback circuit is enabled during the precharge phase, when the bitline is discharged below a preset threshold. The threshold of the secondary precharge circuit can be set such that any skew between the precharge pulses of the secondary precharge circuit and the sense amplifier does not affect the falling bitline during the sense amplifier evaluate phase. Because of the initial surge of precharge from the secondary precharge circuit, the bitline is completely precharged in a shorter cycle time, allowing the sense amplifier to be operated at higher frequencies.

18 Claims, 4 Drawing Sheets

SECONDARY PRECHARGE MECHANISM FOR HIGH SPEED MULTI-PORTED REGISTER FILES

BACKGROUND OF THE INVENTION

1. Field of the Invention

The present invention generally relates to digital electronic circuits, specifically, digital circuits adapted for use with computer systems. More particularly, the present invention relates to a method of precharging sense amplifiers, such as those used with register files of high-speed microprocessors.

2. Description of the Related Art

The basic structure of a conventional computer system includes a central processing unit (CPU) or processor which is connected to several peripheral devices, including input/output (I/O) devices such as a display monitor and keyboard for the user interface, a permanent memory device (such as a hard disk or floppy diskette) for storing the computer's operating system and user programs, and a temporary memory device (such as random-access memory or RAM) that is used by the processor to carry out program instructions. The processor communicates with the peripheral devices by various means, including a bus or a direct channel. A computer system may have many additional components such as serial, parallel, and universal serial bus (USB) ports for connection to, e.g., modems or printers.

A conventional processor configuration includes several execution units (such as fixed-point and floating-point units) and various registers for holding operand data and program instructions, as well as units adapted to route information between the other components. For example, a typical processor includes a bus interface unit (BIU) which controls the flow of data between the processor and the remainder of the data-processing system. The bus interface unit is often connected to both a data cache and an instruction cache which are "on-board", that is, fabricated on the same semiconductor wafer as the processor core. The instruction cache supplies instructions to a branch unit which determines what sequence of instructions is appropriate given the contents of certain general-purpose registers (GPRs), special purpose registers (SPRs), or floating-point registers (FPRs), the availability of a load/store unit (LSU) and the fixed-point and floating-point execution units, and the nature of the instructions themselves. The branch unit may forward the ordered instructions to a dispatch unit, which issues the individual instructions to the appropriate execution unit (i.e., the load/store unit, fixed-point execution unit, or floating-point execution unit).

The contents of a register file are physically read using an array of sense amplifiers. Sense amplifiers can generally be either single-ended or differential. In a traditional differential sense amplifier array, each register or cell has a pair of outputs, viz., a true line (T) and a complementary line (C), which together constitute the "bitline." These lines are connected to the sense amplifier whose output is read by one of the execution units of the processor. During an evaluation cycle, a differential signal is developed between the pair of output lines. In other words, one of the T/C lines is in a high state, while the other is in a low state. Use of two such outputs and a sense amplifier simplifies evaluation since it does not require that the lines have a precise voltage, but rather only requires that there be a discernable difference between the two lines, i.e., one is higher than the other. It is also necessary to restore (precharge) the differential T/C pair after or before each access of the cell, i.e., raise each line to the high state ($V_{dd}$).

It is also necessary to precharge the bitline in a single-ended sense amplifier. As shown in FIG. 1, a typical single-ended sense amplifier 1 has a single input 2 (the read bitline sa_in). The read cycle is initiated with the bitline being precharged and then conditionally being pulled low by the new memory location. During the evaluate phase, a small drop in sa_in is detected using inverter 3 (INV1) and transistor 4 (TN2) to produce full-rail swing at node 5 (lin), which is the input to another inverter 6 (I3) that provides the output 7 (sa_out) of the sense amplifier.

Register files used in high-end microprocessors as on-chip memory may have multiple read and write access ports and large numbers of entries. This construction results in a very large size of the register file, and the register file access lines (the bitlines) end up being very long. Reading the content of the register file through long and highly-loaded read bitlines is usually a processing bottleneck in high-speed register file designs.

To improve the read access timing, oftentimes a small transition in the read bitline voltage is sensed using a sense amplifier, instead of a full swing in the bitline voltage. Both differential as well as single-ended schemes based on a sense amplifier can be used and the trade-offs involved with theses are well-known. However, for multi-ported register files, single-ended sensing schemes result in less on-chip area and usually better timing (speed). For a single-ended sense amplifier scheme such as that illustrated in FIG. 1, during the precharge phase of the clock cycle, the bitline is precharged to a voltage level usually half of the supply voltage ($V_{dd}$). During the evaluate phase of the clock cycle, the read bitline is conditionally discharged to a lower voltage based on the content of the register file. The sense amplifier amplifies this small variation in the read bitline at the input to produce a full-rail transition at the output.

The difference in the precharged voltage and the lower voltage at which the sense amplifier triggers is defined as the "noise margin." This margin is the variation in read bitline voltage (due to electrical noise) which the sense amplifier can tolerate without falsely triggering. There is a direct trade-off between the speed of a sense amplifier and its noise margin. If the bitline is not precharged at the original voltage level after evaluating the read bitline, the noise margin is reduced. For large register files, it has been difficult or impossible to completely precharge the long read bitlines at high clock frequencies (e.g., one gigahertz or more).

In FIG. 1, during the precharge phase, which is enabled via the precharge line 8 (prec_1), the bitline is pulled higher turning off inverter 3 (INV1). The bitline continues to be precharged after INV1 turns off until it reaches the threshold set by inverter 9 (INV2). This additional precharge provides the noise margin for the single-ended sense amplifier. Noise margin of the single-ended sense amplifier is defined as the drop in the sense amplifier input voltage (bitline) from the precharge level to the level where it triggers. Any noise in the bitline of this magnitude will falsely trigger the sense amplifier. The relative sizes of INV1 and INV2 can be adjusted for a desired noise margin; however, the speed at which the sense amplifier can be reliably used is affected by this. For example, if a read bitline is not completely precharged at a particular frequency then, it may have a voltage of only 452 mV at the end of the precharge phase as compared to an original precharge value of 464 mV. The noise margin is reduced by this difference. The sense amplifier detecting inverter INV1 cannot completely detect this state of the bitline, and its output (csgate) does not completely switch. The result is a bump in the csgate node voltage in the next evaluate phase, and any noise on the bitline can falsely trigger the sense amplifier.

By increasing the cycle time (i.e., reducing the speed) the bitline can completely precharge and the original noise margin can be restored. However, at higher frequency the noise margin is sacrificed. Also, since the resistor-capacitor (RC) load of the long bitline is a limiting factor in precharging, adjusting the transistor sizes in the sense amplifier does not solve the problem. It would, therefore, be desirable to devise an improved method of precharging a sense amplifier which improves the noise margin of the sense amplifier, and still allows it to function at higher speed. It would be further advantageous if the method did not add excessive requirements to either chip area or power consumption.

SUMMARY OF THE INVENTION

It is therefore one object of the present invention to provide an improved method of precharging a sense amplifier.

It is another object of the present invention to provide such a method which allows the sense amplifier to maintain a reasonable noise margin at very high clock frequencies.

It is yet another object of the present invention to provide an improved method of precharging sense amplifiers which are used to read large register files of a microprocessor, wherein the register files are connected to the sense amplifiers via long read bitlines.

The foregoing objects are achieved in an electronic circuit generally comprising a register connected to a sense amplifier via a bitline, wherein the sense amplifier has a primary precharge circuit, and a secondary precharge circuit also connected to the bitline. In the illustrative embodiment wherein the bitlines are relatively long, the secondary precharge circuit is located at a distal end of the bitline with respect to the sense amplifier. The secondary precharge circuit initially pulls up the voltage of the bitline, and the primary precharge circuit in the sense amplifier completes the precharging of the bitline. The secondary precharge circuit may include a cascode transistor coupled to the bitline via a feedback circuit. The feedback circuit is enabled during the precharge phase, when the bitline is discharged below a preset threshold. The threshold of the secondary precharge circuit is preferably set such that any skew between the precharge pulses of the secondary precharge circuit and the sense amplifier does not affect the falling bitline during the sense amplifier evaluate phase. Because of the initial surge of precharge from the secondary precharge circuit, the bitline is completely precharged in a shorter cycle time, allowing the sense amplifier to be operated at higher frequencies.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
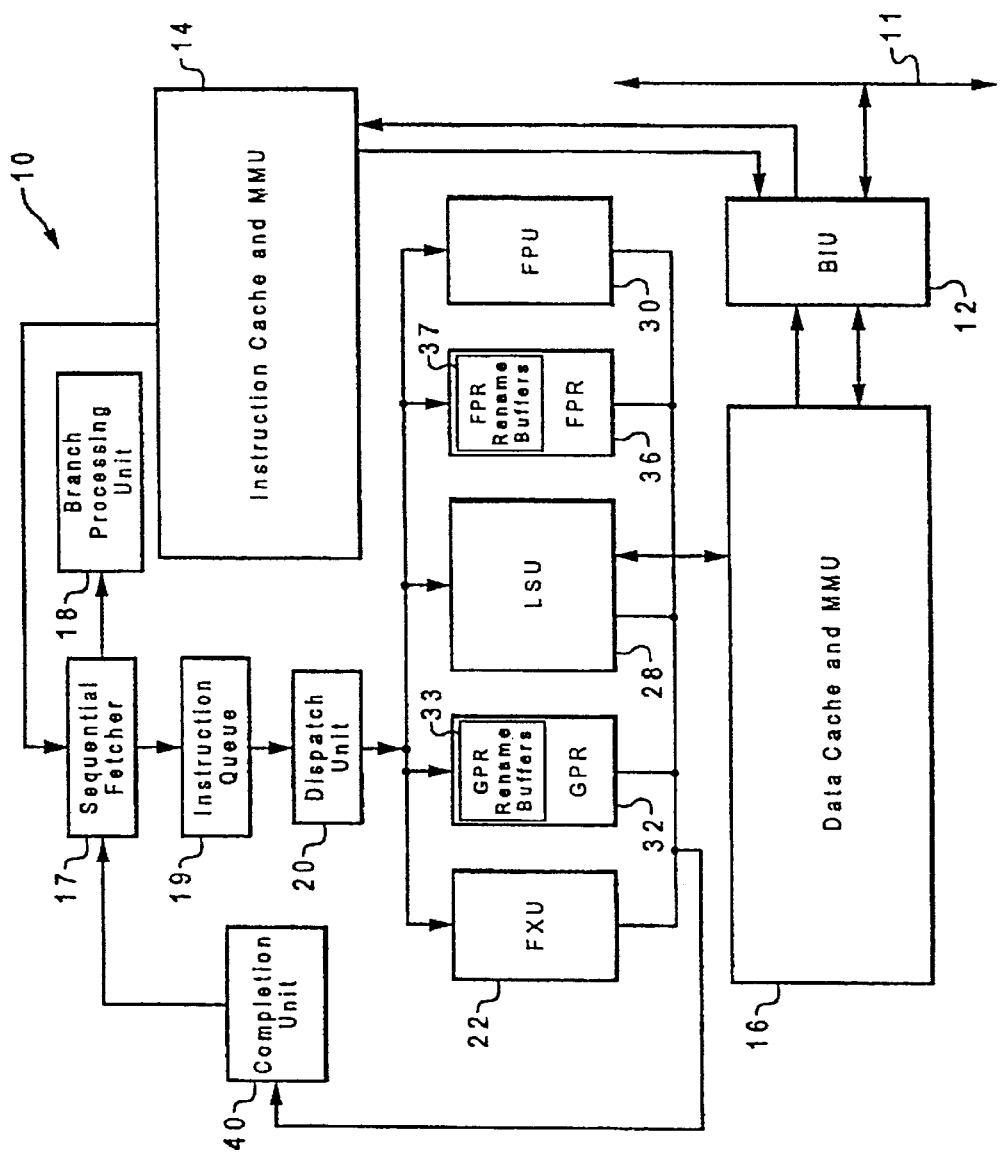
FIG. 2 is a block diagram depicting an exemplary computer processing unit having large register files, in which the present invention may be practiced.

With reference now to the figures and in particular with reference to FIG. 2, there is illustrated a block diagram of a processor, indicated generally at 10, for processing information according to a preferred embodiment of the present invention. In the depicted embodiment, processor 10 comprises a single integrated circuit superscalar microprocessor. Accordingly, as discussed further below, processor 10 includes various execution units, registers, buffers, memories, and other functional units, which are all formed by integrated circuitry. In a preferred embodiment of the present invention, processor 10 operates according to reduced instruction set computing (RISC) techniques. As depicted in FIG. 2, processor 10 is coupled to system bus 11 via a bus interface unit (BIU) 12 within processor 10. BIU 12 controls the transfer of information between processor 10 and other devices coupled to system bus 11, such as a main memory (not illustrated). Processor 10, system bus 11, and the other devices coupled to system bus 11 together form a host data processing system.

BIU 12 is connected to instruction cache 14 and data cache 16 within processor 10. High speed caches, such as instruction cache 14 and data cache 16, enable processor 10 to achieve relatively fast access time to a subset of data or instructions previously transferred from main memory to caches 14 and 16, thus improving the speed of operation of the host data processing system. Instruction cache 14 is further coupled to sequential fetcher 17, which fetches instructions from instruction cache 14 during each cycle for execution. Sequential fetcher 17 transmits branch instructions fetched from instruction cache 14 to branch processing unit (BPU) 18 for execution, but temporarily stores sequential instructions within instruction queue 19 for execution by other execution circuitry within processor 10.

In the depicted embodiment, in addition to BPU 18, the execution circuitry of processor 10 comprises multiple execution units, including fixed-point unit (FXU) 22, load/store unit (LSU) 28, and floating-point unit (FPU) 30. As is well-known to those skilled in the computer arts, each of execution units 22, 28, and 30 executes one or more instructions within a particular class of sequential instructions during each processor cycle. For example, FXU 22 performs fixed-point mathematical operations such as addition, subtraction, ANDing, ORing, and XORing, utilizing source operands received from specified general purpose registers (GPRs) 32 or GPR rename buffers 33. Following the execution of a fixed-point instruction, FXU 22 outputs the data results of the instruction to GPR rename buffers 33, which provide temporary storage for the result data until the instruction is completed by transferring the result data from GPR rename buffers 33 to one or more of GPRs 32. Conversely, FPU 30 performs floating-point operations, such as floating-point multiplication and division, on source operands received from floating-point registers (FPRs) 36 or FPR rename buffers 37. FPU 30 outputs data resulting from the execution of floating-point instructions to selected FPR rename buffers 37, which temporarily store the result data until the instructions are completed by transferring the result data from FPR rename buffers 37 to selected FPRs 36. As its name implies, LSU 28 executes floating-point and fixed-point instructions which either load data from memory (i.e., either data cache 16 or main memory) into selected GPRs 32 or FPRs 36 or which store data from a selected one of GPRs 32, GPR rename buffers 33, FPRs 36, or FPR rename buffers 37 to memory.

Processor 10 employs both pipelining and out-of-order execution of instructions to further improve the performance of its superscalar architecture. Accordingly, instructions can be executed by FXU 22, LSU 28, and FPU 30 in any order as long as data dependencies are observed. In addition, instructions are processed by each of FXU 22, LSU 28, and FPU 30 at a sequence of pipeline stages. As is typical of high-performance processors, each instruction is processed at five distinct pipeline stages, namely, fetch, decode/dispatch, execute, finish, and completion.

During the fetch stage, sequential fetcher 17 retrieves one or more instructions associated with one or more memory addresses from instruction cache 14. Sequential instructions fetched from instruction cache 14 are stored by sequential fetcher 17 within instruction queue 19. Sequential fetcher 17 removes branch instructions from the instruction stream and forwards them to BPU 18 for execution. BPU 18 includes a branch prediction mechanism that enables BPU 18 to speculatively execute unresolved conditional branch instructions by predicting whether the branch will be taken.

During the decode/dispatch stage, dispatch unit 20 decodes and dispatches one or more instructions from instruction queue 19 to the appropriate ones of execution units 22, 28, and 30. Also during the decode/dispatch stage, dispatch unit 20 allocates a rename buffer within GPR rename buffers 33 or FPR rename buffers 37 for each dispatched instructions's result data.

During the execute stage, execution units 22, 28, and 30, execute instructions received from dispatch unit 20 opportunistically as operands and execution resources for the indicated operations are available. After execution has terminated, execution units 22, 28, and 30 store result data within either GPR rename buffers 33 or FPR rename buffers 37, depending upon the instruction type. Then, execution units 22, 28, and 30 notify completion unit 40 which instructions have finished execution. Finally, according to the present invention, instructions are completed by completion unit 40 in program order by transferring result data from GPR rename buffers 33 and FPR rename buffers 37 to GPRs 32 and FPRs 36, respectively.

Figure 3:
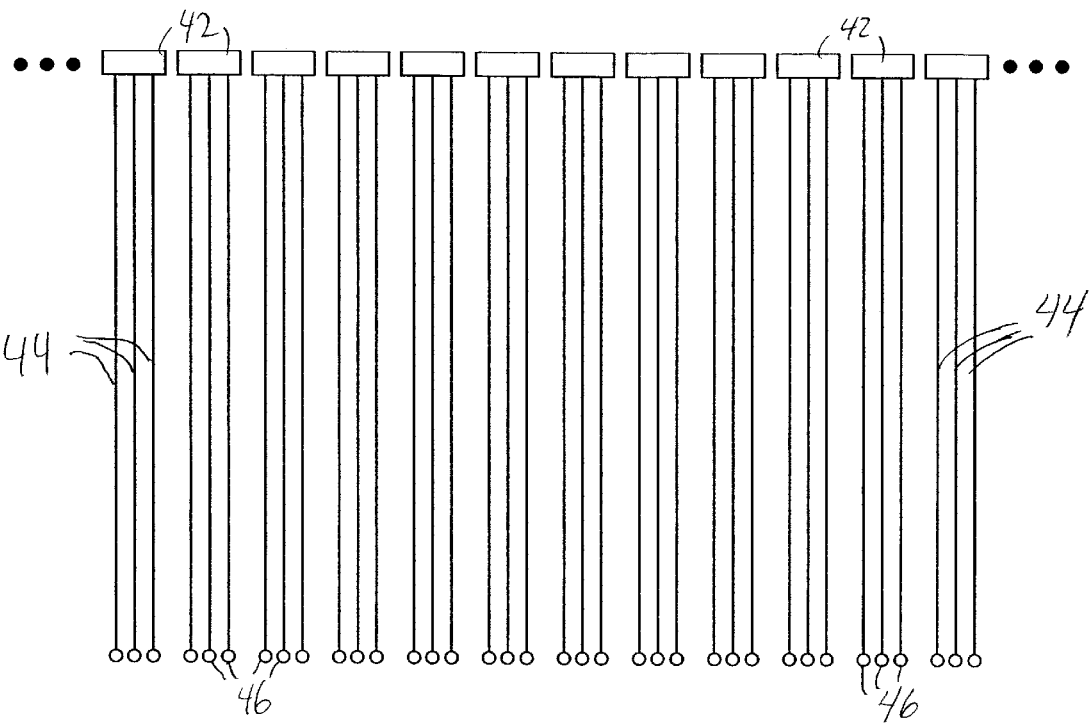
FIG. 3 is a pictorial representation illustrating the long read bitlines that are used to connect the multi-ported registers of the processing unit of FIG. 2 to respective sense amplifiers.

The present invention contemplates the use of large, multi-ported register files in GPRs 32 and FPRs 36. As further shown in FIG. 3, these register files have a large number of entries (individual registers 42). FIG. 3 is a symbolic representation emphasizing the relatively long read bitlines 44 that are used to connected the registers 42 with the respective sense amplifiers 46. Sense amplifiers 46 are used by the various execution units of processing unit 10 to read the register files. The length of these bitlines makes it more difficult to fully precharge them, particularly at high frequencies. As further shown in FIG. 4, the present invention overcomes this limitation by adding a secondary precharge circuit 48 to the register/amplifier circuit, preferably at the distal end of the bitline (i.e., near the register).

Figure 1:
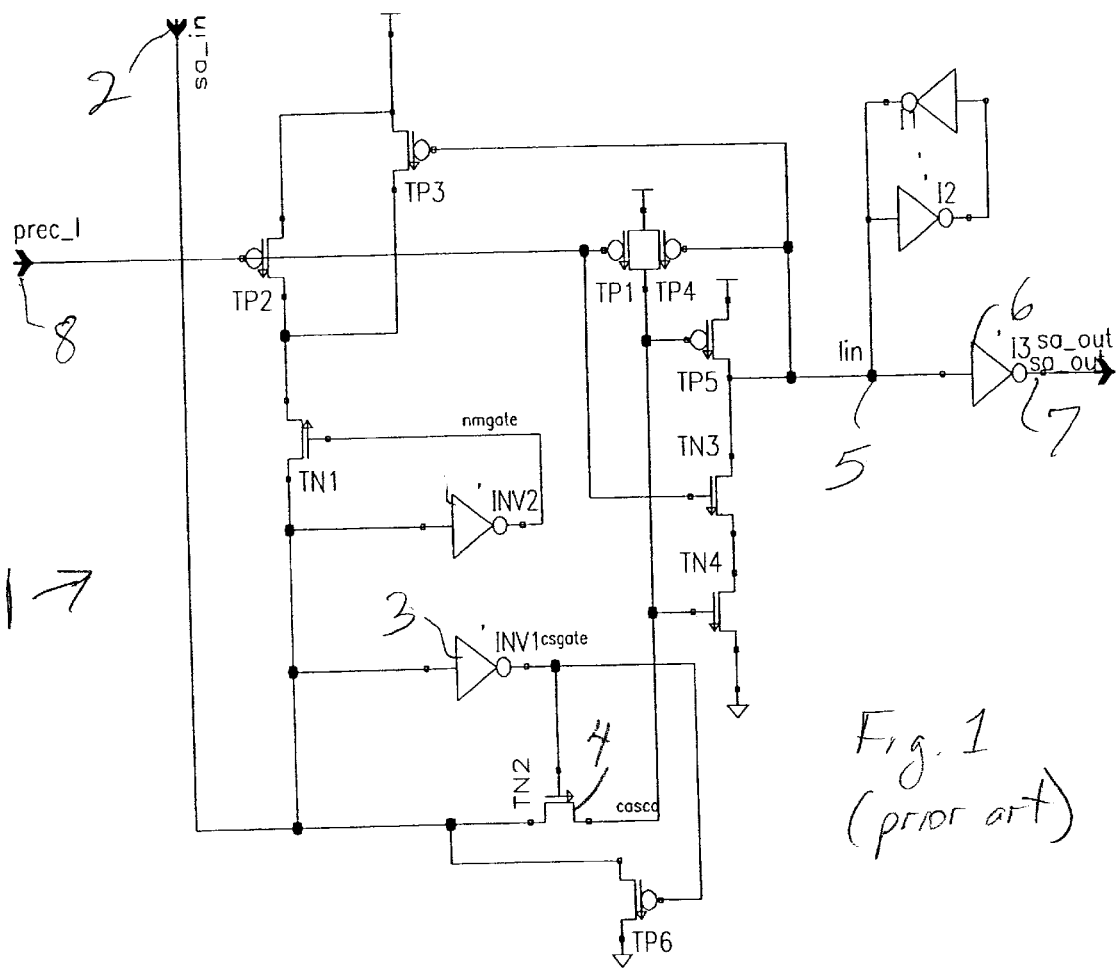
FIG. 1 is a schematic diagram of a prior art single-ended sense amplifier with a precharge mechanism.
Figure 4:
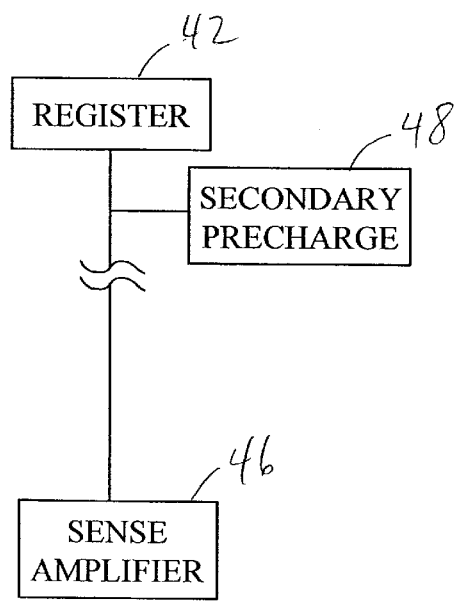
FIG. 4 is a block diagram showing how the present invention provides a secondary precharge circuit for the sense amplifier, at the distal end of the read bitline.

FIG. 4 illustrates only one bitline for simplicity, but it is understood that the registers 42 are preferably multi-ported. Each bitline has a separate secondary precharge circuit 48, i.e., one for each sense amplifier 46. In the preferred embodiment, sense amplifier 46 is a single-ended sense amplifier. The specific construction of sense amplifier 46 is not critical to carrying out the present invention. The construction of the prior art sense amplifier shown in FIG. 1 is acceptable, but those skilled in the art will appreciate that the present invention is not limited to the use of that particular construction.

Figure 5:
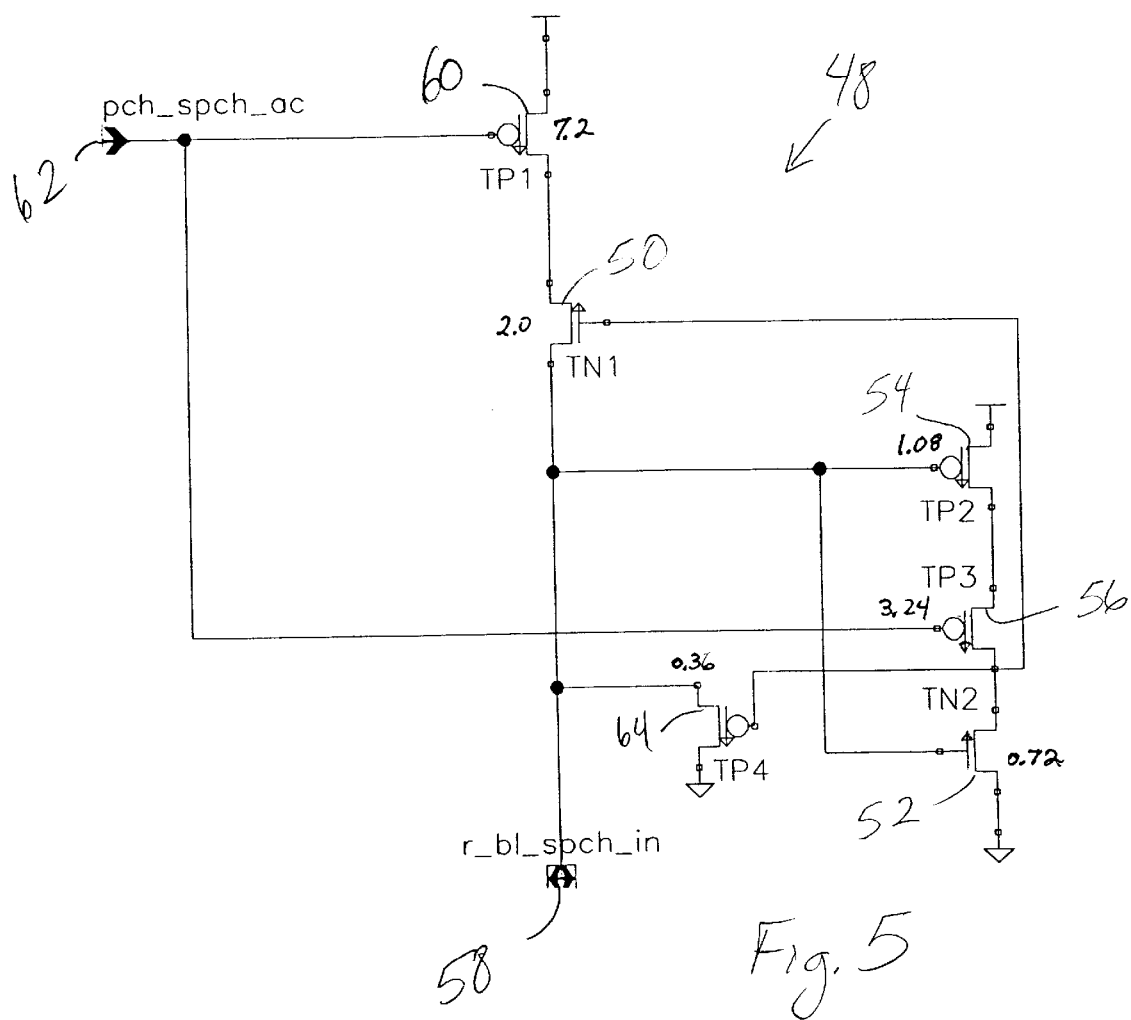
FIG. 5 is a schematic diagram of one embodiment of the secondary.

One embodiment of secondary precharge circuit 48 is shown in FIG. 5. The secondary precharge circuit consists of a cascode transistor 50 (TN1) coupled to the bitline through a feedback circuit consisting of transistors 52 (TN2), 54 (TP2) and 56 (TP3). The source of transistor 50 is connected to the bitline 58, and the drain of transistor 50 is coupled to the supply voltage via another transistor 60 (TP1). The gate of transistor 60 is controlled by the precharge phase signal 62 (pch_spch_ac), which also controls the gate of transistor 56. The gate of transistor 50 is connected to the drains of transistors 52 and 56, which are also connected to the gate of another transistor 64 (TP4). The source of transistor 54 is connected to the supply voltage, while its drain is connected to the source of transistor 56. The source of transistor 52 is connected to electrical ground. The gates of transistors 52 and 54 are controlled by the charge on the bitline.

The feedback circuit is enabled during the precharge phase. If the bitline 58 (r_bl_spch_in) at the far end is discharged below a preset threshold, the feedback circuit triggers and turns on the cascode device 50. The bitline is then pulled higher through the cascode device. The secondary precharge circuit is physically located at the far end of the sense amplifier and the voltages at the two ends are different. The initial pull-up of the bitline thus comes from secondary precharge circuit 48. Transistor 64 (TP4) is used to prevent the bitline from being precharged too high at low frequencies (due to the primary precharge in the sense amplifier)

Once the bitline 58 is pulled higher, the feedback circuit turns off cascode transistor 50 of secondary precharge circuit 48, and normal precharging through the primary precharge circuit of sense amplifier 46 continues at the proximate end of the bitline. Because of the initial surge of precharge from secondary precharge circuit 48, bitline 58 is completely precharged in a shorter cycle time.

If the bitline has not discharged during the previous evaluate phase, the threshold of the feedback circuit is not reached and cascode transistor 50 is not turned on. In other words, secondary precharge circuit 48 does not alter the precharge value of the read bitline if the bitline has not discharged.

The threshold of the secondary precharge circuit is preferably set such that the bitline must drop sufficiently low for the circuit to trigger and pull the bitline back up. This setting ensures that, even in case of skew between the precharge pulses of secondary precharge circuit 48 and sense amplifier 46, the secondary precharge circuit does not affect the falling bitline during the sense amplifier evaluate phase. Skewing the threshold of the secondary precharge circuit in this manner avoids the necessity of a pulse-shaping circuit to overlap the secondary precharge pulse by the sense amplifier precharge pulse. The threshold is set by appropriately sizing transistors TP2, TP3, and TN2. Exemplary sizes are shown in FIG. 5.

In the evaluate phase, the feedback circuit is cut off, and so the secondary precharge does not interfere with the evaluation of the bitline. The cascode transistor and the feedback circuit transistor sizes are such that the gate and diffusion load on the bitline is negligible compared to the huge RC load of the bitline. The bitlines can be 1.5 mm to 2.0 mm long with effective capacitance load in range of 1000 fF–1500 fF in current deep submicron technologies. This is compared with gate and diffusion capacitance of 6 fF due to the secondary pre-charge circuit. Accordingly, secondary precharge circuit 48 does not have any significant effect on the evaluate timing. Since the device size is reasonable and no pulse shaping is required, the area and penalty for the circuit is negligible. Disabling the feedback circuit during evaluate reduces the power consumption due to crowbar currents.

The secondary precharge mechanism disclosed herein ensures correct functionality and improved noise margin without affecting timing for high-speed, large register files with very reasonable area and power trade-offs. The invention is applicable to various types of registers, such as general-purpose registers, floating point registers, special-purpose registers, or other storage cells.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a single-ended sense amplifier, it is applicable as well to differential sense amplifiers. It is therefore contemplated that such modifications can be made without departing from the spirit or scope of the present invention as defined in the appended claims.

What is claimed is:

1. A method of precharging a bitline for a sense amplifier having a primary precharge circuit, comprising the steps of:

discharging the bitline below a preset voltage threshold during an evaluate phase;

enabling a secondary precharge circuit in response to said discharging step;

raising a voltage of the bitline using the secondary precharge circuit, in response to said enabling step;

disabling the secondary precharge circuit after said raising step; and precharging the voltage of the bitline further using the primary precharge circuit of the sense amplifier.

2. The method of claim 1 wherein:

the secondary precharge circuit is physically located at a distal end of the bitline with respect to the sense amplifier; and said raising step initially pulls up the voltage of the bitline at the distal end thereof.

3. The method of claim 1 wherein said enabling step includes the step of enabling a feedback circuit within the secondary precharge circuit.

4. The method of claim 3 wherein said enabling step further includes the step of the feedback circuit turning on a cascode transistor which is coupled to a supply voltage.

5. The method of claim 4 wherein said disabling step includes the step of the feedback circuit turning off the cascode transistor.

6. The method of claim 4 further comprising the step of selecting transistor sizes for the cascode transistor and the feedback circuit such that gate and diffusion loads on the bitline are negligible compared to a resistor-capacitor (RC) load of the bitline.

7. The method of claim 1 further comprising the step of setting the preset voltage threshold sufficiently low such that any skew between the primary precharge circuit and the secondary precharge circuit does not affect the bitline during a subsequent evaluate phase.

8. An electronic circuit for reading a binary value, comprising:

a storage cell;

a sense amplifier;

at least one bitline connecting said sense amplifier to said storage cell;

first means for initially precharging said bitline after a discharge thereof; and second means, separate from said first means, for precharging said bitline to completion.

9. The electronic circuit of claim 8 wherein said second precharging means is located with said sense amplifier.

10. The electronic circuit of claim 8 wherein said first precharging means is located at a distal end of said bitline with respect to said sense amplifier, and said second precharging means is located at a proximate end of said bitline with respect to said sense amplifier.

11. The electronic circuit of claim 8 wherein said sense amplifier is a single-ended sense amplifier.

12. The electronic circuit of claim 8 wherein said first precharging means precharges said bitline in response to said bitline being discharged below a preset voltage threshold.

13. The electronic circuit of claim 12 wherein said first precharging means sets the preset voltage threshold sufficiently low such that any skew between said first precharging means and said second precharging means does not affect said bitline during a subsequent evaluate phase.

14. The electronic circuit of claim 8 wherein said wherein said first precharging means includes a cascode transistor coupled to said bitline via a feedback circuit.

15. The electronic circuit of claim 14 wherein transistor sizes for said cascode transistor and said feedback circuit are selected such that gate and diffusion loads on said bitline are negligible compared to a resistor-capacitor (RC) load of said bitline.

16. The electronic circuit of claim 14 wherein a source of said cascode transistor is connected to said bitline, and a drain of said cascode transistor is coupled to a supply voltage.

17. The electronic circuit of claim 16 wherein said feedback circuit includes:

a first p-type transistor having a source connected to a supply voltage, a gate connected to said bitline, and a drain;

a second p-type transistor having a drain connected to said drain of said first p-type transistor, a gate connected to a precharge phase signal, and a source connected to a gate of said cascode transistor; and an n-type transistor having a source connected to said source of said second p-type transistor, a gate connected to said bitline, and a drain connected to electrical ground.

18. The electronic circuit of claim 16 wherein said drain of said cascode transistor is connected to a drain of a p-type transistor having a source connected to the supply voltage, and having a gate connected to a precharge phase signal.

* * * * *

UNITED STATES PATENT AND TRADEMARK OFFICE
CERTIFICATE OF CORRECTION

PATENT NO.    : 6,466,497 B1
DATED         : October 15, 2002
INVENTOR(S)   : Shaishav A. Desai, Anup S. Mehta and Srinivasa Gopaladhine It is certified that error appears in the above-identified patent and that said Letters Patent is hereby corrected as shown below:

Column 8,
Lines 36 and 37, delete the second instance of "wherein said."

Signed and Sealed this

Eighteenth Day of February, 2003

JAMES E. ROGAN
*Director of the United States Patent and Trademark Office*